United States Patent
Ueda et al.

(10) Patent No.: US 8,076,698 B2
(45) Date of Patent: Dec. 13, 2011

(54) TRANSISTOR AND METHOD FOR OPERATING THE SAME

(75) Inventors: Daisuke Ueda, Osaka (JP); Tsuyoshi Tanaka, Osaka (JP); Yasuhiro Uemoto, Shiga (JP); Tetsuzo Ueda, Osaka (JP); Manabu Yanagihara, Osaka (JP); Masahiro Hikita, Hyogo (JP); Hiroaki Ueno, Osaka (JP)

(73) Assignee: Panasonic Corporation, Osaka (JP)

( * ) Notice: Subject to any disclaimer, the term of this patent is extended or adjusted under 35 U.S.C. 154(b) by 25 days.

(21) Appl. No.: 11/995,040

(22) PCT Filed: Jun. 27, 2006

(86) PCT No.: PCT/JP2006/312830
§ 371 (c)(1),
(2), (4) Date: Jan. 8, 2008

(87) PCT Pub. No.: WO2007/007548
PCT Pub. Date: Jan. 18, 2007

(65) Prior Publication Data
US 2009/0121775 A1    May 14, 2009

(30) Foreign Application Priority Data
Jul. 8, 2005    (JP) ................. 2005-200127

(51) Int. Cl.
*H01L 31/0328* (2006.01)
(52) U.S. Cl. ................. 257/194; 257/E29.249
(58) Field of Classification Search .......... 257/190–201, 257/E21.407, E29.249
See application file for complete search history.

(56) References Cited

U.S. PATENT DOCUMENTS

| | | | |
|---|---|---|---|
| 4,839,703 | A | 6/1989 | Ohata et al. |
| 4,903,091 | A | 2/1990 | Baba et al. |
| 6,281,528 | B1 | 8/2001 | Wada |
| 7,038,252 | B2 | 5/2006 | Saito et al. |
| 2005/0133816 | A1* | 6/2005 | Fan et al. ............. 257/190 |
| 2005/0189559 | A1 | 9/2005 | Saito et al. |
| 2006/0060871 | A1 | 3/2006 | Beach |

FOREIGN PATENT DOCUMENTS

| | | |
|---|---|---|
| JP | 61-140181 | 6/1986 |
| JP | 61-230381 | 10/1986 |
| JP | 62-211963 | 9/1987 |

(Continued)

OTHER PUBLICATIONS

Machine Translation of JP 11-261053.*

(Continued)

*Primary Examiner* — Matthew W Such
*Assistant Examiner* — Ali Naraghi
(74) *Attorney, Agent, or Firm* — McDermott Will & Emery LLP

(57) ABSTRACT

In a transistor, an AlN buffer layer 102, an undoped GaN layer 103, an undoped AlGaN layer 104, a p-type control layer 105, and a p-type contact layer 106 are formed in this order on a sapphire substrate 101. The transistor further includes a gate electrode 110 in ohmic contact with the p-type contact layer 106, and a source electrode 108 and a drain electrode 109 provided on the undoped AlGaN layer 104. By applying a positive voltage to the p-type control layer 105, holes are injected into a channel to increase a current flowing in the channel.

5 Claims, 6 Drawing Sheets

FOREIGN PATENT DOCUMENTS

| JP | 01-183162 | | 7/1989 | |
|---|---|---|---|---|
| JP | 11-261053 | | 9/1999 | |
| JP | 2000-100828 | | 4/2000 | |
| JP | 2003-133332 | | 5/2003 | |
| JP | 2004221363 | * | 8/2004 | .................. 257/194 |
| JP | 2004-273486 | | 9/2004 | |
| JP | 2005-086102 | | 3/2005 | |

OTHER PUBLICATIONS

Hikita, M., et al., "350V/150A AlGaN/GaN power HFET on Silicon substrate with source-via grounding (SVG) structure", Technical Digest of International Electron Devices Meeting, 2004, pp. 803-806, IEEE.

Ambacher, O., et al., "Two-dimensional electron gases induced by spontaneous and piezoelectric polarization charges in N- and Ga-face AlGaN/GaN heterostructures", Journal of Applied Physics, Mar. 15, 2999, pages 3222-3233, vol. 85, No. 6, American institute of Physics.

Zhang, L., et al., "Epitaxially-Grown GaN Junction Field Effect Transistors", IEEE Transactions on Electron Devices, Mar. 2000, pp. 507-511, vol. 47 No. 3, IEEE.

European Search Report issued in European Patent Application No. 06767447.3, mailed May 8, 2009.

Hu, X., et al., "Enhancement mode AlGaN/GaN HFET with selectively grown *pn* junction gate", Electronics Letters, Apr. 13, 2000, pp. 753-754, vol. 36 No. 8.

Japanese Notice of Reasons for Rejection, w/ English translation thereof, issued in Japanese Patent Application No. JP 2005-200127 dated Nov. 16, 2010.

* cited by examiner

TRANSISTOR AND METHOD FOR OPERATING THE SAME

RELATED APPLICATIONS

This application is the U.S. National Phase under 35 U.S.C. §371 of International Application No. PCT/JP2006/312830, filed on Jun. 27, 2006, which in turn claims the benefit of Japanese Application No. 2005-200127, filed on Jul. 8, 2005, the disclosures of which Applications are incorporated by reference herein.

TECHNICAL FIELD

The present invention relates to transistors, and in particular to transistors with nitride semiconductors applicable to switching power transistors and the like.

BACKGROUND ART

In recent years, field effect transistors (referred hereinafter to as FETs) made of gallium nitride (GaN)-based materials have been actively studied as high-frequency, high-power devices. Since nitride semiconductor materials such as GaN can be mixed with aluminum nitride (AlN), indium nitride (InN), and the like to form various types of mixed crystals, they can form heterojunctions like conventional compound-semiconductor materials such as gallium arsenide (GaAs). In the heterojunction composed of the nitride semiconductor, however, spontaneous polarization or piezoelectric polarization in the film constituting the junction generates high concentrations of carriers at its heterointerface even with no doping performed thereon. As a result of this, in the case where a FET is fabricated from this material, the fabricated FET is likely to exhibit depletion type (normally-on type) characteristics, and hence it is difficult for the FET to exhibit enhancement-type (normally-off type) characteristics. However, most devices currently used in the power electronics market are normally-off type devices, so that normally-off type GaN-based nitride semiconductor devices are strongly demanded.

Hereinafter, a conventional FET using a nitride semiconductor material will be described.

FIG. 9 is a sectional view of the conventional FET using AlGaN/GaN heterojunction, and FIG. 10 is a diagram showing distribution of fixed charges and free electrons induced by polarization in the conventional FET shown in FIG. 9. FIG. 11 is an energy band diagram of the conventional FET, and FIG. 12 is a graph plotting the relation between the gate voltage and the drain current obtained from such a FET using two-dimensional electron gas as a carrier.

Referring to FIG. 9, the conventional FET formed of a nitride semiconductor includes: a sapphire substrate 1901 having the (0001) plane as a principal plane; an undoped GaN layer 1902 provided on the sapphire substrate 1901; an undoped AlGaN layer 1903 provided on the undoped GaN layer 1902; a source electrode 1905 and a drain electrode 1906 of Ti/Al and a gate electrode 1907 of palladium (Pd), which are provided on the undoped AlGaN layer 1903; and a passivation film 1904 of SiN covering the undoped AlGaN layer 1903. The undoped AlGaN layer 1903 is made of undoped $Al_{0.25}Ga_{0.75}N$.

In the conventional FET shown in FIG. 9, spontaneous polarization and piezoelectric polarization inherent in the materials constituting the undoped AlGaN layer 1903 generate two-dimensional electron gas of about $1 \times 10^{13}$ cm$^{-2}$ at the heterojunction interface between the undoped GaN layer 1902 and the undoped AlGaN layer 1903 even though no impurity is introduced thereinto.

As shown in FIG. 10, negative fixed charges are generated in the top surface of the undoped AlGaN layer 1903 (the surface closer to the gate electrode 1907) and the top surface of the undoped GaN layer 1902, and positive fixed charges are generated in the bottom surface of the undoped AlGaN layer 1903 (the surface closer to the sapphire substrate 1901) and the bottom surface of the undoped GaN layer 1902. Since the absolute value of the amount of fixed charges generated in the AlGaN surface is greater than the absolute value of the amount of fixed charges generated in the GaN surface, sheet carriers with an amount capable of compensating the fixed charge difference therebetween are generated in the form of two-dimensional electron gas in a portion of the heterointerface closer to the undoped GaN layer 1902 (Ns in FIG. 10). Note that in FIG. 10, the solid arrow represents fixed charges generated in the undoped AlGaN layer 1903 and the dashed arrow represents fixed charges generated in the undoped GaN layer 1902.

This polarization generates an electric field in the undoped GaN layer 1902 and the undoped AlGaN layer 1903, and thus the energy band diagram in this state has a profile as shown in FIG. 11. Specifically, the edge of the valence band of the undoped GaN layer 1902 around the heterointerface has a potential energy below the Fermi level. As a result, the conventional FET basically exhibits normally-on type electrical properties as shown in FIG. 12.

Furthermore, the source electrode 1905 and the drain electrode 1906 are in contact with the undoped AlGaN layer 1903. If the thickness of the undoped AlGaN layer 1903 is as small as, for example, 30 nm or smaller, a channel region (a portion of the undoped GaN layer 1902 in this structure) where two-dimensional electron gas is generated is electrically connected by a tunnel current to the source electrode 1905 and the drain electrode 1906. Therefore, the source electrode 1905 and the drain electrode 1906 can both function as good ohmic electrodes. In addition, since the gate electrode of Pd has a work function as great as 5.1 eV, it can function as a good Schottky junction to the undoped AlGaN layer 1903 (see Non-Patent Document 1).

In order to exhibit normally-off characteristics using the GaN-based semiconductor material with the above-shown polarization, it is necessary to reduce carriers generated in the channel by spontaneous polarization and piezoelectric polarization inherent in the crystal. In the case of the FET using the heterojunction composed of AlGaN and GaN, decreasing the Al composition in the AlGaN layer reduces stress caused by the lattice constant difference from GaN. This reduces piezoelectric polarization, resulting in a decrease in sheet carrier concentration (see Non-Patent Document 2). To be more specific, when the Al mole fraction in the undoped AlGaN layer 1903 is decreased to 0.15 with its thickness kept to 30 nm, the sheet carrier concentration significantly decreases from $1.4 \times 10^{13}$ cm$^{-2}$ to $5 \times 10^{12}$ cm$^{-2}$. A decrease in carrier concentration in turn reduces operating current. In addition to this, decreasing the Al composition in the undoped AlGaN layer 1903 also lowers the potential barrier of the gate portion.

In order to suppress the occurrence of leakage current in the gate electrode, the forward voltage capable of being applied to the gate electrode 1907 has an upper limit. This makes it impossible to raise the gate voltage, and thus a sufficient increase in the drain current is also difficult.

To deal with such a difficulty and provide a normally-off type transistor capable of applying a high forward voltage, proposal is made of the structure in which a gate portion is formed of a p-type region to enhance the potential barrier.

This is the structure of a junction field effect transistor (abbreviated hereinafter as a JFET). The JFET is described in Non-Patent Document 3 and Patent Document 1.

[Non-Patent Document 1] M. Hikita et al., Technical Digest of 2004 International Electron Devices Meeting (2004) pp. 803-806

[Non-Patent Document 2] O. Ambacher et al., J. Appl. Phys. Vol. 85 (1999) pp. 3222-3233

[Non-Patent Document 3] L. Zhang et al., IEEE Transactions on Electron Devices, vol. 47, no. 3, pp. 507-511, 2000

[Patent Document 1] Japanese Unexamined Patent Publication No. 2004-273486

DISCLOSURE OF INVENTION

Problems to be Solved by the Invention

However, in the case where the JFET described above is fabricated to exhibit normally-off characteristics, even though a forward bias is applied to the gate electrode, it is difficult to increase the concentration of electrons generated in the channel to almost the same amount as that of the normally-on type JFET. Furthermore, the voltage of the forward bias capable of being applied to the gate electrode is up to the voltage at which a gate leakage current starts flowing, specifically, up to about 3 V in consideration of the band gap. This makes it difficult for the conventional technique to provide a normally-off type JFET capable of offering a sufficient drain current.

In view of the foregoing problems, an object of the present invention is to provide a semiconductor device which can exhibit normally-off characteristics and concurrently offer an increased drain current, and to provide its operation method.

Means for Solving the Problems

To attain the above object, a transistor and its operation method according to the present invention are constructed as follows.

A transistor according to the present invention includes: a first semiconductor layer containing a channel region; a second semiconductor layer provided on or above the channel region and having a larger band gap than the channel region; a control region provided inside, on, or above the second semiconductor layer and having a p-type conductivity; a gate electrode provided in contact with a portion of the control region; and a source electrode and a drain electrode provided beside both sides of the control region, respectively, and the gate electrode is forward biased with respect to the source electrode to inject holes into the channel region, thereby controlling a current flowing between the source electrode and the drain electrode.

With this structure, the injected holes can induce electrons in the channel region to drastically increase the amount of current flowing in the channel region. In the transistor according to the present invention, as the constituent materials for the first semiconductor layer, the second semiconductor layer, and the control region, use is made of various materials such as Si- or arsenic-based compound semiconductors or nitride semiconductors. Among them, even in the case of using a nitride semiconductor there as, in the state in which no voltage is applied to the control region, two-dimensional electron gas is compensated by holes injected from the second semiconductor layer or the control region into the first semiconductor layer. Thus, normally-off characteristics can be attained. In particular, if the constituent material for the first semiconductor layer containing the channel region is a nitride semiconductor, the mobility of holes in the channel region is extremely lower than the mobility of electrons therein. As a result, the holes hardly contribute to a current flowing in the channel region, so that the amount of holes from the second semiconductor layer or the control region can be controlled to allow a larger current to flow in the channel region and the like than the conventional transistor.

An inner portion of the first semiconductor layer located below the channel region is provided with a semiconductor layer having a larger band gap than the channel region. Thereby, the potential barrier is generated also between the channel region and the provided semiconductor layer, so that holes injected into the channel region are accumulated in the channel region without dissipation. This enables further enhancement of the electron concentration in the channel region. Moreover, if the first semiconductor layer and the second semiconductor layer are both made of nitride semiconductors, the provided semiconductor layer can also be made of a nitride semiconductor to reduce the difference in the amount of spontaneous polarization between the layers located on the top and bottom of the channel region. Therefore, normally-off operations can be implemented easily.

Two or more regions having the p-type conductivity and different impurity concentrations are provided inside the control region, and the impurity concentrations are set to have an upwardly increasing gradient. This sufficiently lowers the concentration of the p-type impurities contained in the layer in contact with the first semiconductor layer, so that passage of a current flowing through traps can be suppressed between the gate electrode and the source electrode.

A method for operating a transistor according to the present invention is a method for operating a transistor which includes: a first semiconductor layer containing a channel region; a second semiconductor layer provided on or above the channel region and having a larger band gap than the channel region; a control region provided inside, on, or above the second semiconductor layer and having a p-type conductivity; a gate electrode provided in contact with a portion of the control region; and a source electrode and a drain electrode provided beside both sides of the control region, respectively, and the method includes the step of injecting holes from the control region or the second semiconductor layer into the channel region, thereby controlling a current flowing between the source and drain electrodes through the channel region.

With this operation method, the control region can be forward biased with respect to the source electrode (a positive voltage is applied to the control region side) to provide a large current.

TECHNICAL ADVANTAGES

As described above, with the transistor and its operation method according to the present invention, the control region containing p-type impurities is provided on or above the channel region, and the control region can be forward biased with respect to the source electrode to selectively inject only holes into the channel region. As a result, the injected holes promote generation of electrons in the channel region, which enables a drastic increase in the channel current. Accordingly, a normally-off type transistor with a large operating current can be provided.

Figure 1:
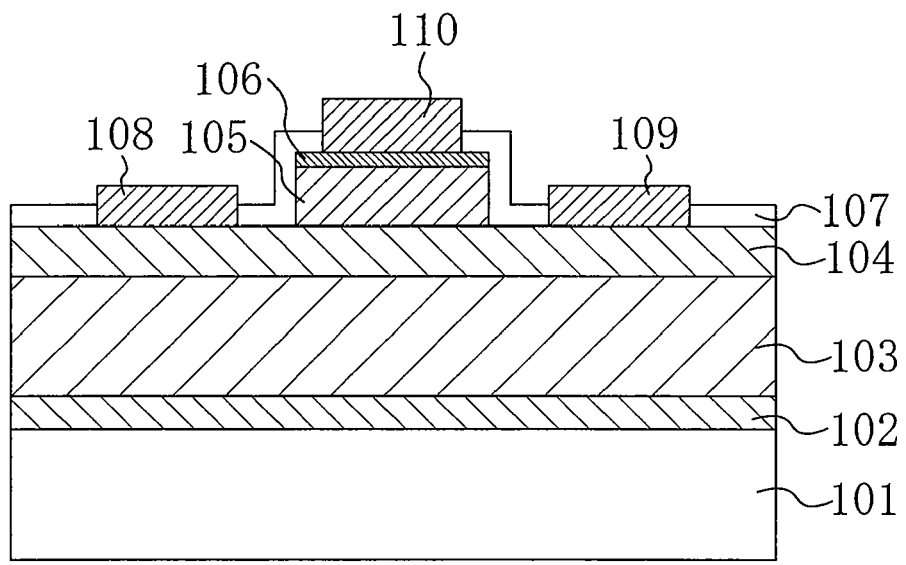
FIG. 1 is a sectional view showing a nitride semiconductor device according to a first embodiment of the present invention.

EXPLANATION OF REFERENCES 101, 701 sapphire substrate
102, 402, 702 AlN buffer layer
103, 404, 703 undoped GaN layer
104, 405, 704 undoped AlGaN layer
105, 406 p-type control layer
106, 407, 707 p-type contact layer
107, 408, 708 passivation film
108, 409, 709 source electrode
109, 410, 710 drain electrode
110, 411, 711 gate electrode
401 n-type Si substrate
403 underlying undoped AlGaN layer
705 lightly doped p-type control layer
706 heavily doped p-type control layer

BEST MODE FOR CARRYING OUT THE INVENTION

Embodiments of the present invention will be described below with reference to the accompanying drawings.

First Embodiment

FIG. 1 is a sectional view showing a nitride semiconductor device according to a first embodiment of the present invention.

Referring to FIG. 1, the nitride semiconductor device according to the first embodiment includes a sapphire substrate 101, an AlN buffer layer 102, an undoped GaN layer 103, an undoped AlGaN layer 104, a p-type control layer 105, and a p-type contact layer 106. The sapphire substrate 101 has the (0001) plane as a principal plane. The AlN buffer layer 102 is provided on the (0001) plane of the sapphire substrate 101. The undoped GaN layer 103 is provided on the AlN buffer layer 102. The undoped AlGaN layer 104 is provided on the undoped GaN layer 103. The p-type control layer 105 is provided on a portion of the undoped AlGaN layer 104, and made of AlGaN containing p-type impurities. The p-type contact layer 106 is provided on the p-type control layer 105, and made of GaN containing p-type impurities with a higher concentration than those in the p-type control layer 105. Furthermore, the nitride semiconductor device according to the first embodiment includes a gate electrode 110, a source electrode 108, a drain electrode 109, and a passivation film 107. The gate electrode 110 of Ni is provided on the p-type contact layer 106, and comes into ohmic contact with the p-type contact layer 106. The source electrode 108 and the drain electrode 109 are made of a Ti layer and an Al layer provided on the undoped AlGaN layer 104 to interpose the gate electrode 110. The passivation film 107 is made of SiN, and covers the top surface of the undoped AlGaN layer 104.

In the nitride semiconductor device according to the first embodiment, the undoped AlGaN layer 104 and the p-type control layer 105 are both made of $Al_{0.2}Ga_{0.8}N$. The undoped AlGaN layer 104 has a larger band gap than the undoped GaN layer 103, so that hetero barrier is produced at the interface between the undoped GaN layer 103 and the undoped AlGaN layer 104. At the heterointerface between the undoped GaN layer 103 and the undoped AlGaN layer 104, two-dimensional electron gas is generated during device operation.

The AlN buffer layer 102 has a thickness of, for example, 100 nm, the undoped GaN layer 103 has a thickness of, for example, 2 µm, and the undoped AlGaN layer 104 has a thickness of, for example, 25 nm. In addition, the p-type control layer 105 has a thickness of, for example, 100 nm, and the p-type contact layer 106 has a thickness of, for example, 5 nm.

The p-type control layer 105 is doped with magnesium (Mg) with an impurity concentration of about $1\times10^{19}$ cm$^{-3}$. The p-type contact layer 106 is injected with Mg with an impurity concentration of about $1\times10^{20}$ cm$^{-3}$.

The p-type control layer 105 and the p-type contact layer 106 are etched in the shape of stripes each having a width of 1.5 µm when viewed from the top of the substrate, and the gate electrode 110 provided on the p-type contact layer 106 has a width of 1 µm. In the p-type control layer 105 and the p-type contact layer 106, portions other than a control region (a gate region) are removed by etching. In the cross section of the device in the gate length direction shown in FIG. 1, the distance between the bottom end of the p-type control layer 105 and the end of the drain electrode 109 is 5 µm or greater, which provides a sufficiently increased drain breakdown voltage. The material for the gate electrode 110 is not limited to Ni, and the material such as Pd capable of making an ohmic junction with the p-type contact layer 106 can be employed instead.

In the nitride semiconductor device according to the first embodiment, the source electrode 108 and the drain electrode 109 are both in contact with the undoped AlGaN layer 104. However, since the thickness of the undoped AlGaN layer 104 is sufficiently thin, a tunnel current flows through the undoped AlGaN layer 104 during device operation. Thus, the source electrode 108 and the drain electrode 109 can function as ohmic electrodes electrically connected to the heterointerface where two-dimensional electron gas is generated during operation. In addition to this construction, by diffusing Si in regions of the undoped AlGaN layer 104 located below the source electrode 108 and the drain electrode 109, better ohmic junctions can also be made between the electrodes and the interface. In order to pass the tunnel current, in particular preferably, the thickness of the undoped AlGaN layer 104 is 30 nm or smaller.

Although not shown in FIG. 1, the nitride semiconductor device may have an isolation region for providing electrical isolation from an adjacent semiconductor device. The isolation region is formed by implanting, for example, boron (B) ions into portions of the undoped AlGaN layer 104 and the undoped GaN layer 103 to increase the resistance of the portions of these layers.

The nitride semiconductor device according to the first embodiment operates as a transistor.

Figure 2:
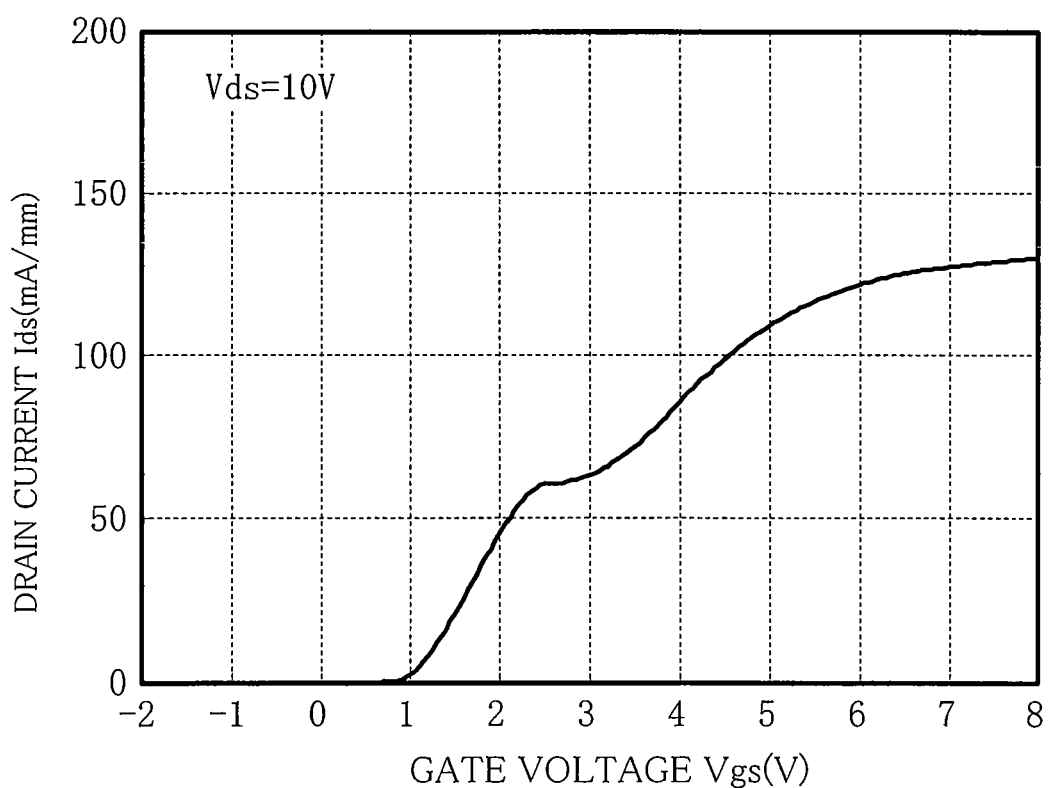
FIG. 2 is a graph showing the relation between the voltage applied to a control region and the drain current in the nitride semiconductor device according to the first embodiment.
Figure 3:
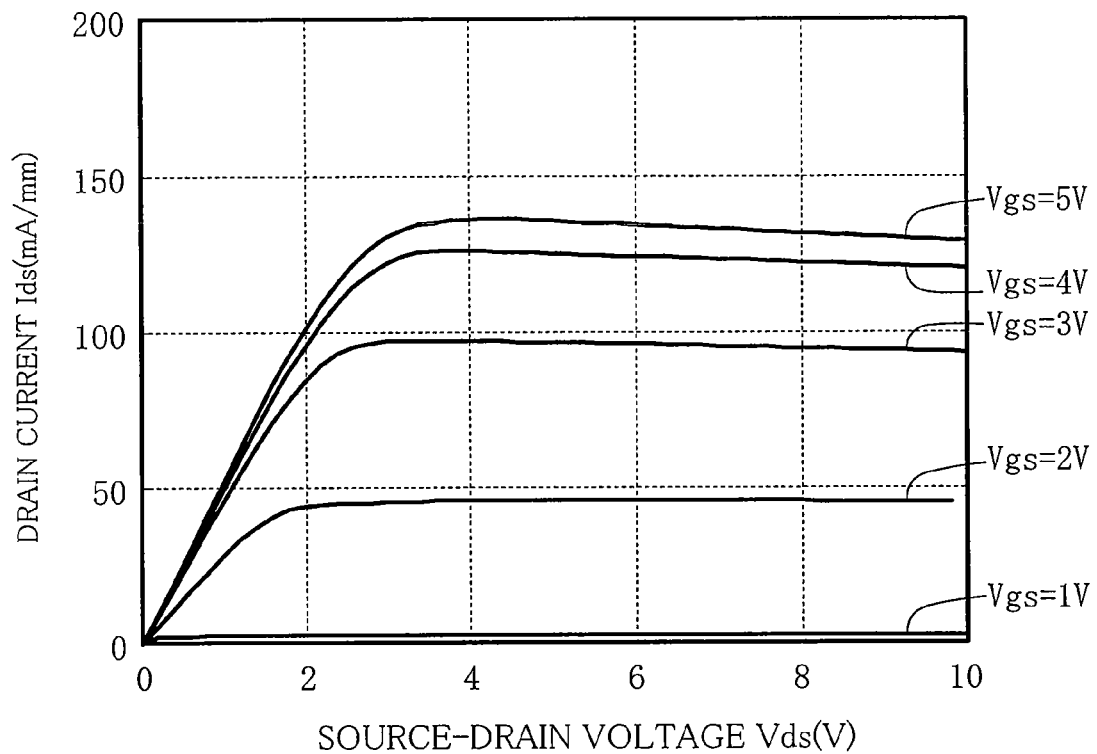
FIG. 3 is a graph showing the relation between the source-drain voltage and the drain current in the case where the voltage applied to the control region is changed in the nitride semiconductor device according to the first embodiment.

FIG. 2 is a graph showing the relation between the voltage (which is represented as the gate voltage Vgs in FIG. 2) applied to the control region (the gate region) and the drain current in the nitride semiconductor device of the first embodiment, and FIG. 3 is a graph showing the relation between the source-drain voltage and the drain current in the case where the voltage applied to the control region is changed in the nitride semiconductor device of the first embodiment. FIG. 2 shows the drain current obtained when the source-drain voltage Vds is set at 10 V.

As shown in FIG. 2, the nitride semiconductor device of the first embodiment has a threshold voltage of about 1 V, and exhibits normally-off characteristics. In addition, as shown in FIG. 3, even though a positive bias of 5 V or higher is applied to the gate electrode 110, remarkable gate leakage current is not observed and a drain current of about 130 mA/mm at the maximum can be provided. Furthermore, from the change in the drain current shown in FIG. 2, it is observed that the nitride semiconductor device of the first embodiment has two operation modes. To be more specific, within the range of the control voltage (the gate voltage) from 0 to about 2.5 V, the nitride semiconductor device of the first embodiment operates as a JFET, and when the control voltage approaches about 2.5 V, an increase in the drain current stops temporarily (the first mode). Then, when the control voltage becomes 2.5 V or higher, the nitride semiconductor device enters the second mode. In particular, when a control voltage is higher than 3 V, a current increases. In the second mode, holes are injected from the p-type control layer 105 into the upper portion of the undoped GaN layer 103 acting as a channel. According to a rise in the control voltage, the drain current increases monotonously. When holes are injected into the upper portion of the undoped GaN layer 103, that is, around the interface thereof with the undoped AlGaN layer 104, free electrons as many as the injected holes are generated around the interface with the undoped AlGaN layer 104, which results in an increase in drain current.

The more characteristic point is that as shown in FIG. 3, even though a sufficiently great forward bias is applied to the p-type control layer 105, the offset range of the drain voltage does not appear noticeably at the origin point of the drain current. This means that due to an extremely lower mobility of holes in the undoped GaN layer 103 than that of electrons, the flow of holes in the channel does not cause noticeable voltage drop in the channel.

As described above, the nitride semiconductor device according to the first embodiment has normally-off characteristics. Therefore, in the case where it is used as a power device, current flow in the state in which power supply is stopped can be prevented to avoid troubles such as breaks of peripheral circuits. Moreover, since a higher voltage can be applied to the gate electrode 110 than the conventional nitride semiconductor device, a high drain current can be provided even by the normally-off type device.

The above-described nitride semiconductor device of the first embodiment can be fabricated using the following method.

First, on the (0001) plane of the sapphire substrate 101 (see FIG. 1 for the reference numerals used herein), the AlN buffer layer 102, the undoped GaN layer 103, the undoped AlGaN layer 104, the p-type control layer 105, and the p-type contact layer 106 are sequentially formed by a MOCVD method. In this formation, Mg may be introduced in advance into the p-type control layer 105 and the p-type contact layer 106, or Mg ion implantation thereinto may be made after deposition of the p-type control layer 105 and the p-type contact layer 106.

Next, by dry etching such as ICP etching, portions of the p-type contact layer 106 and the p-type control layer 105 other than the gate region are selectively removed.

Subsequently, by a CVD method with $SiH_4$, $NH_3$, and $N_2$, a passivation film 107 is formed over the substrate.

By ICP dry etching or the like, portions of the passivation film 107 are formed with openings, and the openings are formed with the source electrode 108 and the drain electrode 109, respectively, which are made of a Ti layer and an Al layer. Then, a thermal treatment is performed at 650° C. in a $N_2$ atmosphere.

Next, by ICP dry etching or the like, a portion of the passivation film 107 located on the p-type contact layer 106 is removed, and then the resulting opening of the passivation film 107 is formed with the gate electrode 110 made of Ni. In the manner described above, the nitride semiconductor device according to the first embodiment can be fabricated.

The foregoing description has been made of the example in which a sapphire substrate using the (0001) plane as a principal plane is employed as a substrate. However, any substrate such as a SiC substrate, a GaN substrate, or a Si substrate may be employed. Alternatively, a substrate with any plane orientation may be employed as long as a semiconductor layer with a good crystallinity can be grown thereon.

The p-type control layer 105 and the undoped AlGaN layer 104 do not have to have the same Al composition, and, for example, the p-type control layer 105 may be made of p-type GaN. However, if the p-type control layer 105 is formed to have a larger band gap than the undoped GaN layer 103 where a channel is produced, the amount of holes injected into the channel can be made greater than the amount of electrons injected from the channel into the p-type control layer 105. This enables an increase in the carrier concentration in the channel.

The device structure of the first embodiment can be constructed even using a compound semiconductor such as GaAs other than a nitride semiconductor. For example, GaAs may be used instead of GaN, and AlGaAs may be used instead of AlGaN. Alternatively, the same structure as that of the first embodiment can also be constructed using, instead of the GaN/AlGaN heterojunction, a Si/SiGe heterojunction.

In the nitride semiconductor device of the first embodiment, a region of the undoped AlGaN layer 104 located immediately below the gate electrode 110 may contain p-type impurities diffused from the p-type control layer 105.

Second Embodiment

Figure 4:
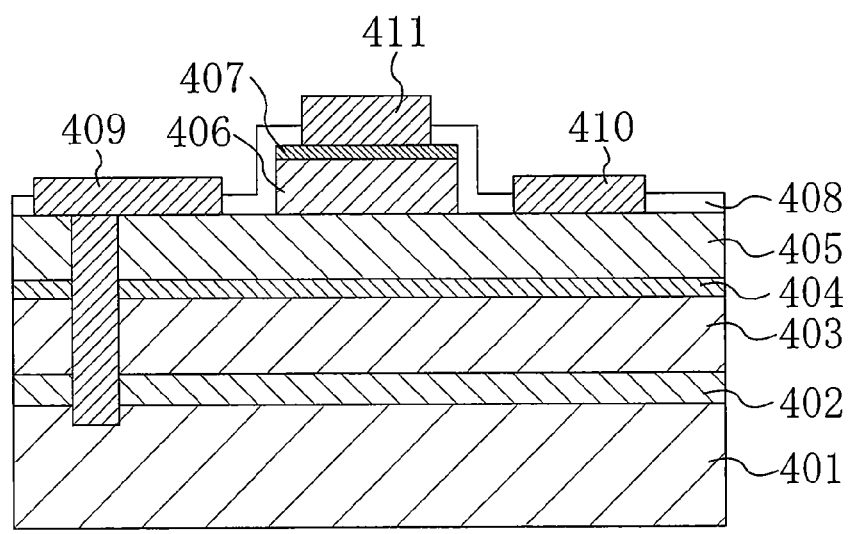
FIG. 4 is a sectional view showing a nitride semiconductor device according to a second embodiment of the present invention.

FIG. 4 is a sectional view showing a nitride semiconductor device according to a second embodiment of the present invention.

Referring to FIG. 4, the nitride semiconductor device according to the second embodiment includes an n-type Si substrate 401, an AlN buffer layer 402, an underlying undoped AlGaN layer 403, an undoped GaN layer 404, an undoped AlGaN layer 405, a p-type control layer 406, and a p-type contact layer 407. The n-type Si substrate 401 has the (111) plane as a principal plane. The AlN buffer layer 402 is provided on the (111) plane of the n-type Si substrate 401. The underlying undoped AlGaN layer 403 is provided on the AlN buffer layer 402. The undoped GaN layer 404 is provided on the underlying undoped AlGaN layer 403. The undoped AlGaN layer 405 is provided on the undoped GaN layer 404. The p-type control layer 406 is provided on a portion of the undoped AlGaN layer 405, and made of AlGaN containing p-type impurities. The p-type contact layer 407 is provided on the p-type control layer 406, and made of GaN containing p-type impurities with a higher concentration than those in the p-type control layer 406. Furthermore, the nitride semiconductor device according to the second embodiment includes a gate electrode 411, a source electrode 409, a drain electrode 410, and a passivation film 408. The gate electrode 411 of Ni is provided on the p-type contact layer 407, and comes into ohmic contact with the p-type contact layer 407. The source electrode 409 and the drain electrode 410 are made of a Ti layer and an Al layer provided on the undoped AlGaN layer 405. The passivation film 408 is made of SiN, and covers the top surface of the undoped AlGaN layer 405.

In the nitride semiconductor device according to the second embodiment, the underlying undoped AlGaN layer 403, the undoped AlGaN layer 405, and the p-type control layer 406 are both made of $Al_{0.2}Ga_{0.8}N$, but these layers may have different Al compositions. However, the band gaps of the underlying undoped AlGaN layer 403 and the undoped AlGaN layer 405 are larger than the band gap of the undoped GaN layer 404, so that the device has a so-called double hetero structure.

The AlN buffer layer 402 has a thickness of, for example, 40 nm, the underlying undoped AlGaN layer 403 has a thickness of, for example, 1 μm, the undoped GaN layer 404 has a thickness of, for example, 3 nm, and the undoped AlGaN layer 405 has a thickness of, for example, 25 nm. In addition, the p-type control layer 406 has a thickness of, for example, 100 nm, and the p-type contact layer 407 has a thickness of, for example, 5 nm. The concentrations of p-type impurities (Mg) contained in the p-type control layer 406 and the p-type contact layer 407 are the same as those of the nitride semiconductor device of the first embodiment.

In the nitride semiconductor device according to the second embodiment, in order to reduce the resistance of an interconnect connected to the electrode, the source electrode 409 is connected to the n-type Si substrate 401 through a via penetrating the undoped AlGaN layer 405, the undoped GaN layer 404, and the underlying undoped AlGaN layer 403.

Figure 5:
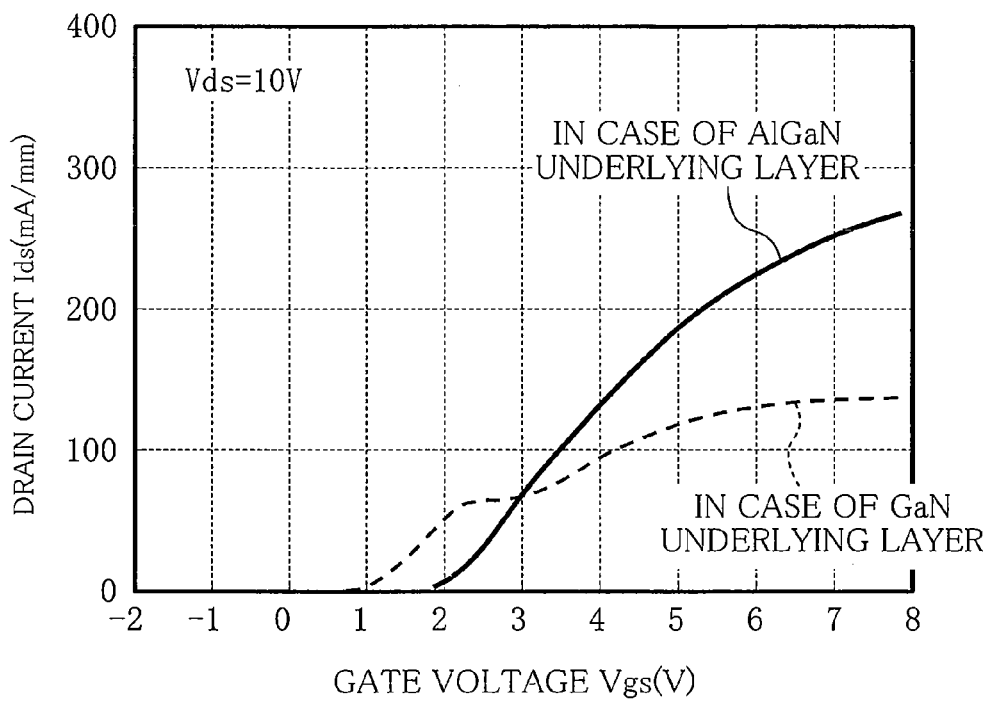
FIG. 5 is a graph showing the relation between the voltage applied to a control region and the drain current in the nitride semiconductor device according to the second embodiment.
Figure 6:
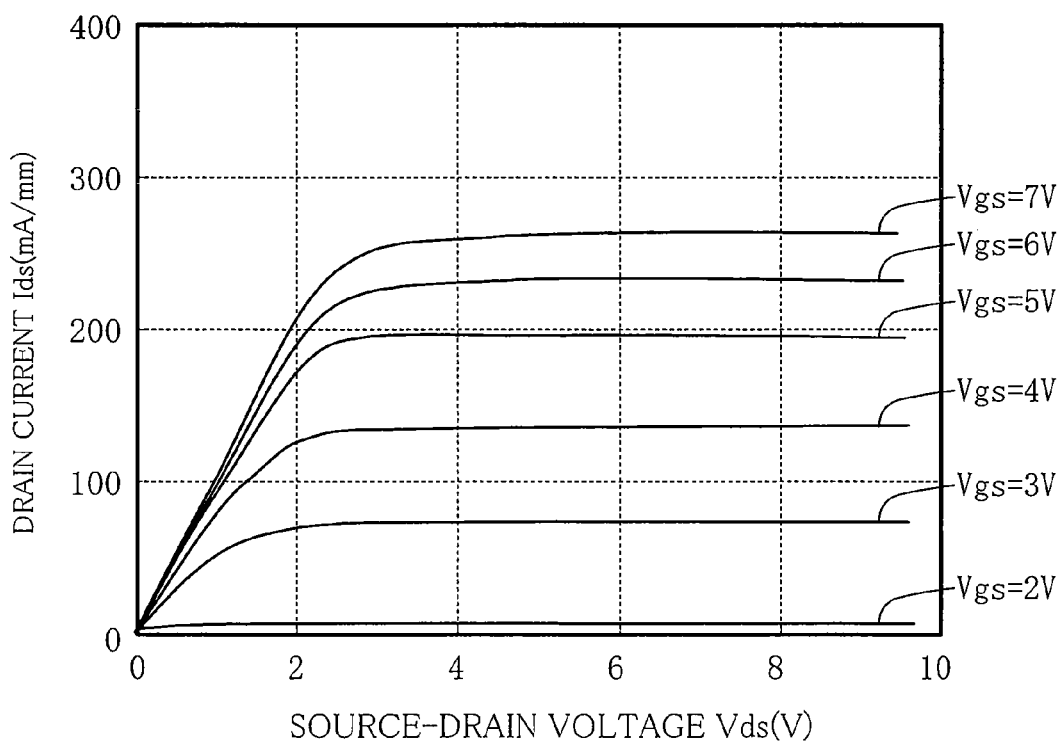
FIG. 6 is a graph showing the relation between the source-drain voltage and the drain current in the case where the voltage applied to the control region is changed in the nitride semiconductor device according to the second embodiment.

FIG. 5 is a graph showing the relation between the voltage (the gate voltage Vgs) applied to the control region (the gate region) and the drain current in the nitride semiconductor device of the second embodiment, and FIG. 6 is a graph showing the relation between the source-drain voltage and the drain current in the case where the voltage applied to the control region is changed in the nitride semiconductor device of the second embodiment. In FIG. 5, the result of the measurement obtained from the nitride semiconductor device according to the first embodiment (the dotted curve in this figure) is also shown for comparison purposes.

From the result shown in FIG. 5, it is found that the nitride semiconductor device of the second embodiment has a threshold voltage of about 2 V and exhibits normally-off characteristics. In addition, as shown in FIG. 6, even though a positive bias of 7 V or higher is applied to the gate electrode 411, no gate leakage current flows and a drain current of about 270 mA/mm at the maximum can be provided.

For the nitride semiconductor device according to the second embodiment, the undoped GaN layer 404 acting as a channel is vertically sandwiched by the AlGaN layers with an Al mole fraction of 20%. With this structure, within the undoped GaN layer 404 with no bias applied to the p-type control layer 406, the effect of spontaneous polarization is compensated to produce the state in which no carrier is present. Thus, the nitride semiconductor device according to the second embodiment has a higher threshold voltage than the nitride semiconductor device according to the first embodiment.

As shown in FIG. 5, in the nitride semiconductor device according to the second embodiment, when the control voltage is beyond 2 V which is the threshold voltage, the drain current sharply increases. In the nitride semiconductor device of the second embodiment, since no carrier is present within the channel in the state of a control voltage of 0 V, it is conceivable that the drain current obtained in applying the control voltage is generated entirely by holes flowing from the p-type control layer 406. This will be the reason why a kink of the electrical properties is not observed which is seen in the case where the undoped GaN layer is provided below the undoped AlGaN layer. Moreover, since hetero barriers are generated on the top and bottom of the undoped GaN layer 404, holes injected from the p-type control layer 406 are accumulated in the undoped GaN layer 404. Therefore, the amount of free electrons induced by the holes can be increased. Accordingly, the nitride semiconductor device of the second embodiment can provide a higher drain current than the nitride semiconductor device of the first embodiment.

In the nitride semiconductor device according to the second embodiment, the underlying undoped AlGaN layer 403 and the undoped AlGaN layer 405 provided on the top and bottom of the undoped GaN layer 404 are set to have the same Al mole fraction. However, even in the case where the underlying undoped AlGaN layer 403 is set to have a lower Al mole fraction than the undoped AlGaN layer 405, provision of the p-type control layer 406 can raise the potential of the channel portion to attain the normally-off characteristics.

As described above, with the nitride semiconductor device according to the second embodiment, a normally-off type device can be provided in which only the holes are injected as mentioned above to flow the drain current and confinement of holes within the channel is promoted to flow a larger operating current.

Third Embodiment

Figure 7:
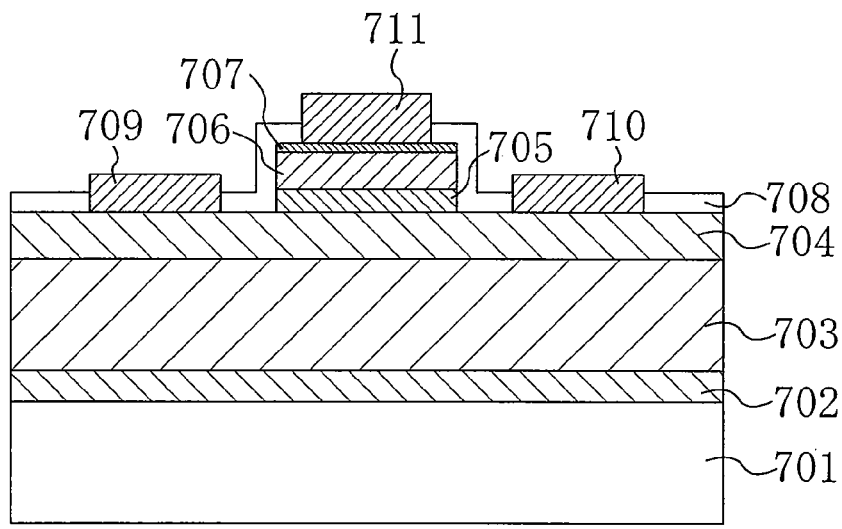
FIG. 7 is a sectional view showing a nitride semiconductor device according to a third embodiment of the present invention.

FIG. 7 is a sectional view showing a nitride semiconductor device according to a third embodiment of the present invention.

Referring to FIG. 7, the nitride semiconductor device according to the third embodiment includes a sapphire substrate 701, an AlN buffer layer 702, an undoped GaN layer 703, an undoped AlGaN layer 704, a lightly doped p-type control layer 705, a heavily doped p-type control layer 706, and a p-type contact layer 707. The sapphire substrate 701 has the (0001) plane as a principal plane. The AlN buffer layer 702 is provided on the (0001) plane of the sapphire substrate 701. The undoped GaN layer 703 is provided on the AlN buffer layer 702. The undoped AlGaN layer 704 is provided on the undoped GaN layer 703. The lightly doped p-type control layer 705 is provided on a portion of the undoped AlGaN layer 704, and made of AlGaN containing p-type impurities. The heavily doped p-type control layer 706 is provided on the lightly doped p-type control layer 705, and contains p-type impurities with a higher concentration than the lightly doped p-type control layer 705. The p-type contact layer 707 is provided on the heavily doped p-type control layer 706, and made of GaN containing p-type impurities with a higher concentration than the heavily doped p-type control layer 706. Furthermore, the nitride semiconductor device according to the third embodiment includes a gate electrode 711, a source electrode 709, a drain electrode 710, and a passivation film 708. The gate electrode 711 is provided on the p-type contact layer 707. The source electrode 709 and the drain electrode 710 are provided on the undoped AlGaN layer 704. The passivation film 708 covers the top surface of the undoped AlGaN layer 704.

The nitride semiconductor device according to the third embodiment is characterized in that the p-type control layer is divided into the lightly doped p-type control layer 705 and the heavily doped p-type control layer 706 and that the p-type control layer in contact with the undoped AlGaN layer has a lower impurity concentration than those of the first and second nitride semiconductor devices. The other structure thereof is the same as the structure of the nitride semiconductor device of the first embodiment.

Both of the lightly doped p-type control layer 705 and the heavily doped p-type control layer 706 have a thickness of 50 nm, and are made of $Al_{0.2}Ga_{0.8}N$.

The lightly doped p-type control layer 705 is doped with Mg with an impurity concentration of about $5\times10^{18}$ cm$^{-3}$, and the heavily doped p-type control layer 706 is doped with Mg with an impurity concentration of about $1\times10^{19}$ cm$^{-3}$. The p-type contact layer 707 is doped with Mg with an impurity concentration of about $1\times10^{20}$ cm$^{-3}$.

Figure 8:
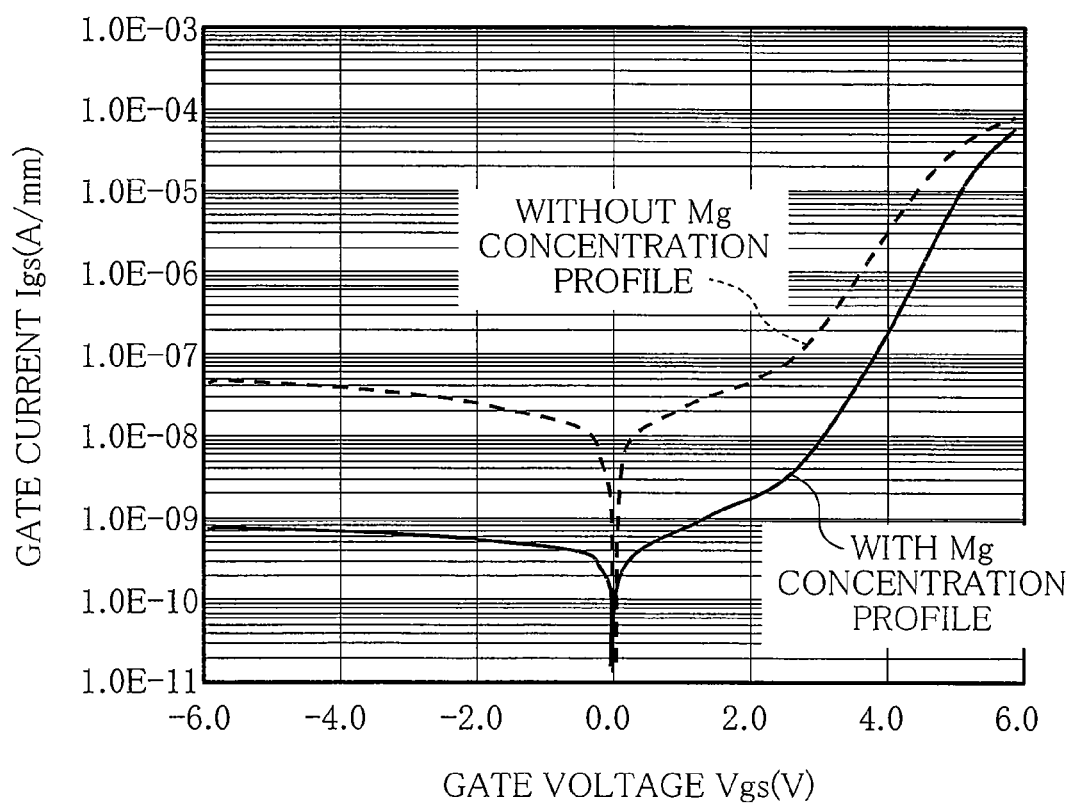
FIG. 8 is a graph showing the relation between the voltage applied to a control region and the current flowing through a gate electrode in the nitride semiconductor device according to the third embodiment.
Figure 9:
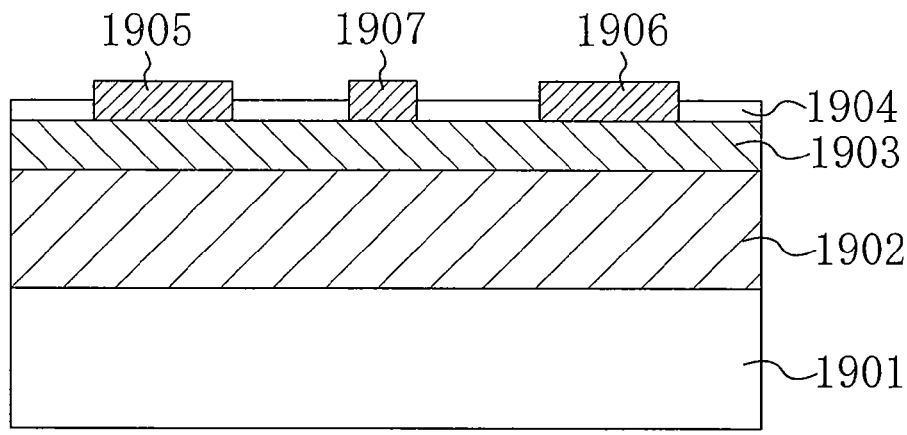
FIG. 9 is a sectional view of a conventional FET using AlGaN/GaN heterojunction.
Figure 10:
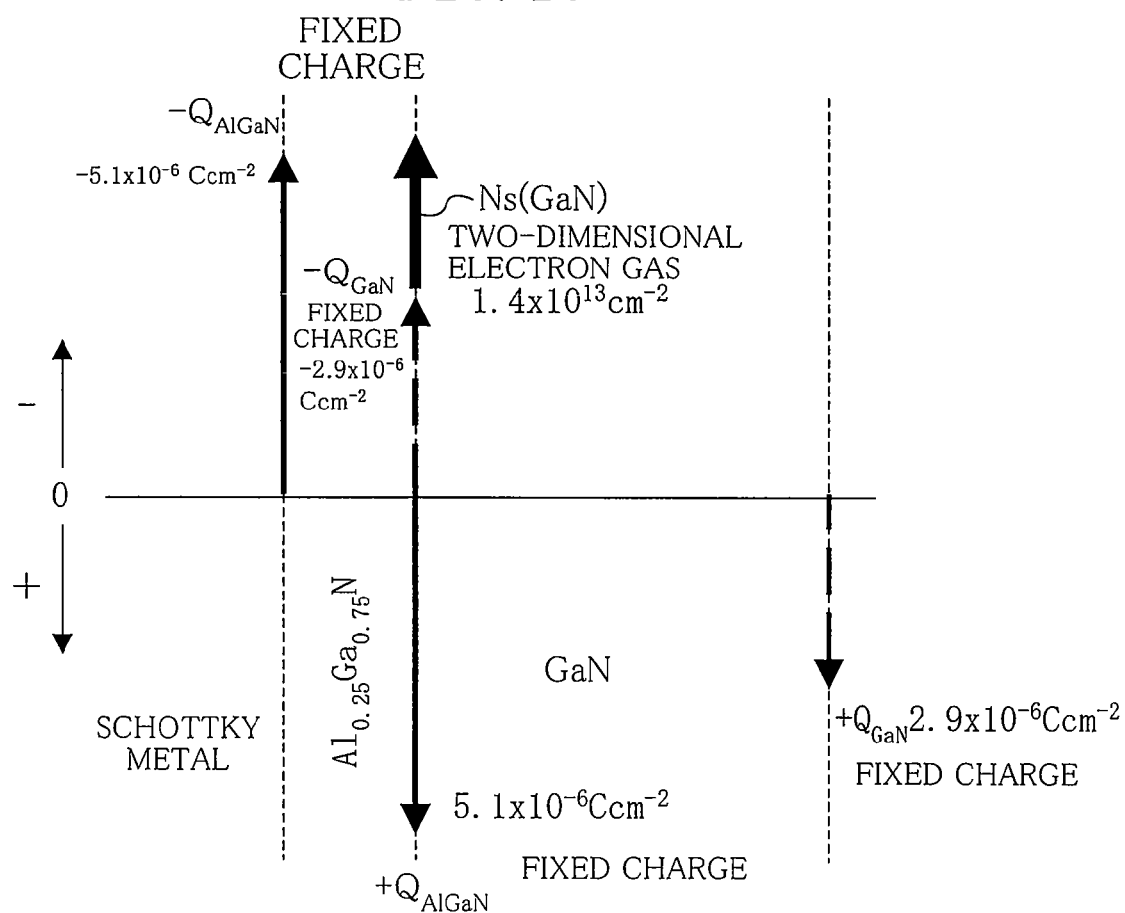
FIG. 10 is a diagram showing distribution of fixed charges and free electrons induced by polarization in the conventional FET shown in FIG. 9.
Figure 11:
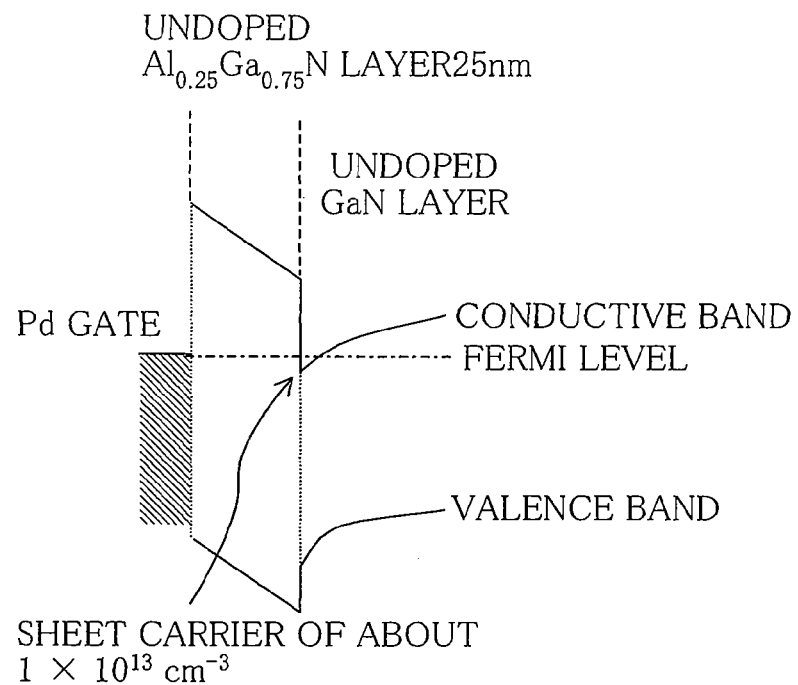
FIG. 11 is an energy band diagram of the conventional FET using a nitride semiconductor.
Figure 12:
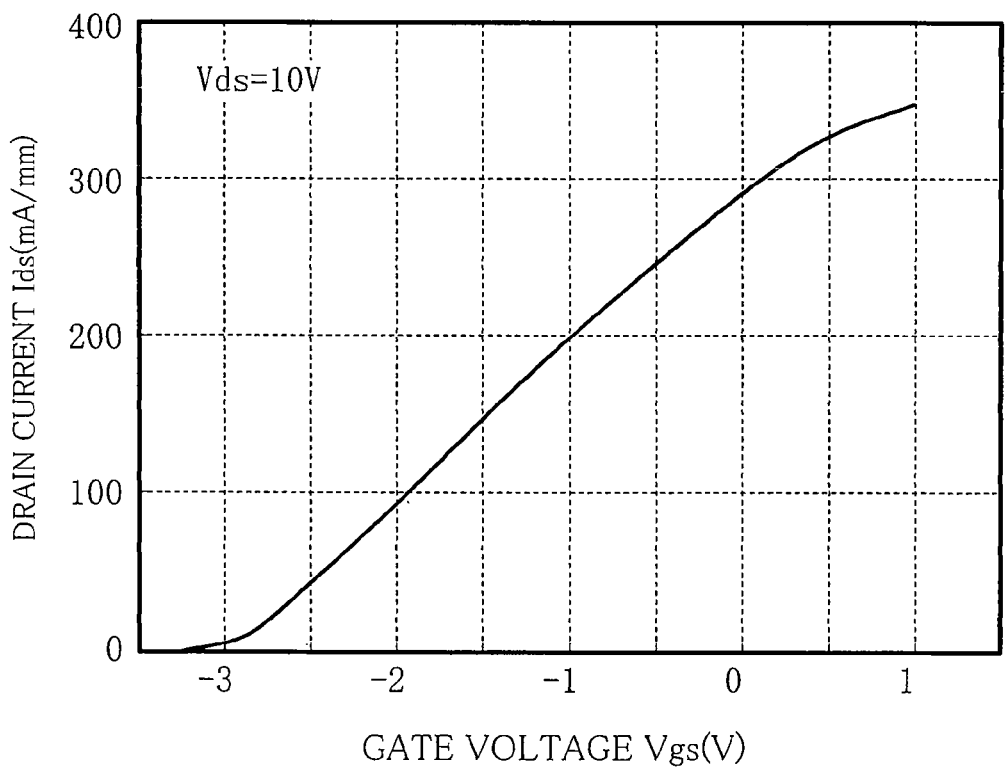
FIG. 12 is a graph plotting the relation between the gate voltage and the drain current obtained from the conventional FET using a nitride semiconductor.

FIG. 8 is a graph showing the relation between the voltage (the gate voltage Vgs) applied to the control region and the current flowing through the gate electrode (the gate current Igs) in the nitride semiconductor device of the third embodiment. In FIG. 8, the solid curve represents the electrical properties of the nitride semiconductor device of the third embodiment in which a Mg concentration profile is provided to the p-type control layer, while the dotted curve represents the electrical properties of the nitride semiconductor device of the first embodiment in which no Mg concentration profile is provided to the p-type control layer.

From the result shown in FIG. 8, it is found that for the nitride semiconductor device of the third embodiment, leakage current flowing in the gate electrode 711 remarkably decreases as compared with the case where the lightly doped p-type control layer 705 is not provided. This is probably because provision of the lightly doped p-type control layer 705 can reduce leakage current flowing through Mg-involved traps.

As described above, with the nitride semiconductor device according to the third embodiment, an increased operating current and a decreased leakage current can be provided even by the normally-off type device.

As is apparent from the above, the transistor according to the present invention has structural similarity to the JFET, and in addition holes can be injected one-directionally from the wide band-gap region through the heterojunction into the channel. Thus, the drain current can be increased significantly. In particular, since the nitride semiconductor has an extremely lower hole mobility than the electron mobility, the injected holes effectively serve only to increase the electron concentration in the channel. This eliminates device-design tradeoffs in which provision of normally-off characteristics inevitably causes a decrease in drain current.

INDUSTRIAL APPLICABILITY

The transistor according to the present invention can be utilized as, for example, a power transistor with a high breakdown voltage for use in various types of switching equipment.

What is claimed is:

1. A transistor comprising:
a Si substrate;
an underlying layer provided on the Si substrate;
a first semiconductor layer provided on the underlying layer and having a smaller band gap than the underlying layer, and containing a channel region;
a second semiconductor layer provided on or above the channel region and having a larger band gap than the channel region;
a control region provided inside, on, or above the second semiconductor layer and having a p-type conductivity; a gate electrode provided in contact with a portion of the control region; and a source electrode and a drain electrode provided beside both sides of the control region, respectively,
wherein the gate electrode is forward biased with respect to the source electrode to inject holes into the channel region, thereby controlling a current flowing between the source electrode and the drain electrode,
the underlying layer, the first semiconductor layer, the second semiconductor layer, and the control region are each made of a semiconductor compound containing nitrogen, and
a total impurity concentration of the control region is larger than a concentration of two dimensional electron gas, with no bias voltage applied to the gate electrode, generated in the heterojunction interface between the first semiconductor layer and the second semiconductor layer.

2. The transistor of claim 1, wherein the holes are accumulated in the first semiconductor layer by the underlying layer.

3. The transistor of claim 1, wherein two or more regions having the p-type conductivity and different impurity concentrations are provided inside the control region, and the impurity concentrations are set to have an upwardly increasing gradient.

4. A method for operating a transistor which comprises: a Si substrate; an underlying layer provided on the Si substrate; a first semiconductor layer provided on the underlying layer and having a smaller band gap than the underlying layer, and containing a channel region; a second semiconductor layer provided on or above the channel region and having a larger band gap than the channel region; a control region provided inside, on, or above the second semiconductor layer and having a p-type conductivity; a gate electrode provided in contact with a portion of the control region; and a source electrode and a drain electrode provided beside both sides of the control region, respectively,
wherein the method includes the step of injecting holes from the control region or the second semiconductor layer into the channel region, thereby controlling a current flowing between the source and drain electrodes through the channel region, the underlying layer, the first semiconductor layer, the second semiconductor layer, and the control region are each made of a semiconductor compound containing nitrogen, and
a total impurity concentration of the control region is larger than a concentration of charge, with no bias voltage applied to the gate electrode, generated in the heterojunction interface between the first semiconductor layer and the second semiconductor layer.

5. The method of claim 4, wherein the holes are accumulated in the first semiconductor layer by the underlying layer.

* * * * *